July 2, 1963 J. L. BALL ETAL 3,096,491
QUICK DISCHARGE CIRCUIT FOR A MAGNETRON
Filed Oct. 19, 1961
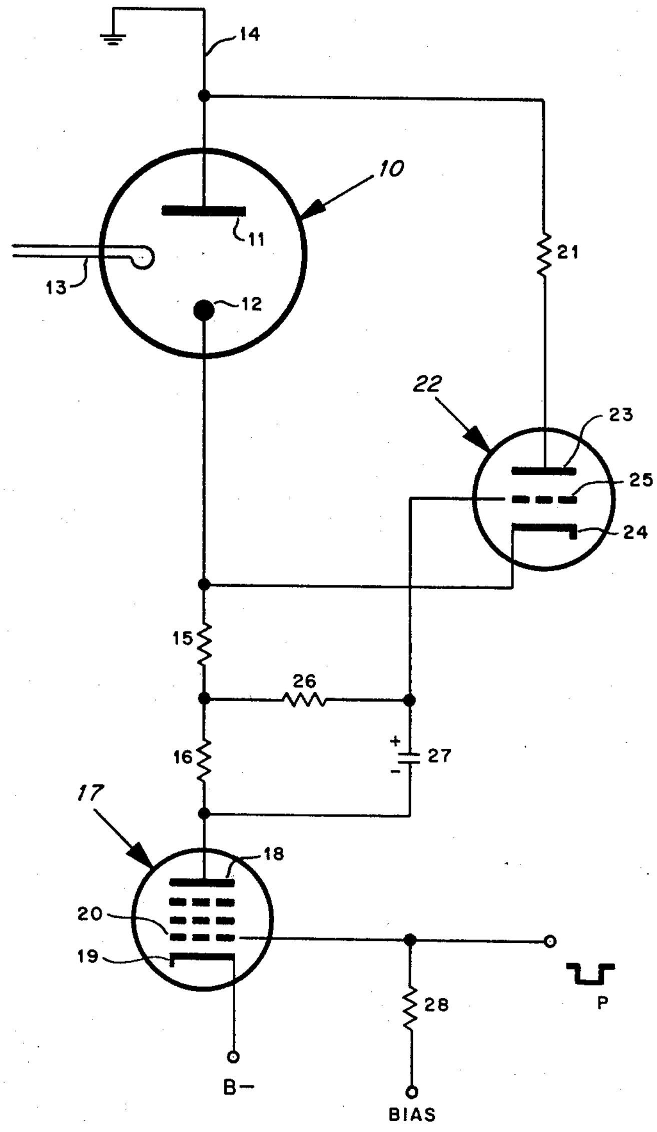
INVENTORS
JOSEPH L. BALL
GERALD F. ROSS
ROBERT H. EDMONDS
BY
ATTORNEY United States Patent Office 3,096,491

Patented July 2, 1963

3,096,491

QUICK DISCHARGE CIRCUIT FOR A MAGNETRON

Joseph L. Ball, Teaneck, N.J., and Robert H. Edmonds, New York, and Gerald F. Ross, Plainview, N.Y., assignors, by mesne assignments, to the United States of America as represented by the Secretary of the Navy Filed Oct. 19, 1961, Ser. No. 146,384

4 Claims. (Cl. 331—87)

This invention relates to a magnetron quick discharge circuit and more particularly to a quick discharge circuit for rapidly switching a magnetron oscillator off and on.

In many applications, such as in radar systems, it is necessary to periodically turn off a magnetron oscillator for a very short time. Simple removal of power from a magnetron oscillator will not stop the magnetron oscillator from oscillating until a relatively long time after the actual removal of power. This is true because the elements of a magnetron oscillator tend to hold voltages for several microseconds after power has been removed. Thus the problem of turning off a magnetron oscillator becomes one of stopping the magnetron oscillator from oscillating within a very short time, for example three microseconds, after actual power has been removed therefrom.

Oscillations of a magnetron oscillator are, in part, determined by the magnitude of the voltage across it. When the voltage across a magnetron oscillator is, for example, 3000 volts, a magnetron oscillator will not stop oscillating until the voltage across it has decreased to approximately 1000 volts. The principal problem in stopping a magnetron oscillator from oscillating after power has been removed becomes one of determining a way or a means to rapidly decrease the voltage across the magnetron oscillator.

One of the chief ways of stopping a magnetron oscillator from oscillating after power has been removed is the injection by a driving circuit of a large voltage pulse into the magnetron oscillator in phase opposition to the normal voltage across it. By the sheer brute force of high amplitude voltage pulse from a driving circuit, voltage across the magnetron oscillator is reduced to a point where the oscillations of the magnetron oscillator cease. Needless to say, such a method results in excessive heat generation in the magnetron oscillator and also introduces undesirable phase shifts. In order to combat these disadvantages it is necessary to utilize a great many circuit components both to protect the magnetron oscillator from excessive heat and also to insure reliability of operation. A circuit utilizing the brute force voltage method for stopping the oscillations of a magnetron oscillator normally uses of the magnitude of approximately 50 components. The magnetron discharge circuit of this invention accomplishes the same result by using only 7 circuit components.

The present invention contemplates a circuit for use with a magnetron oscillator by which the magnetron oscillator may be turned off for a very short time. The circuit of this invention provides means for discharging a magnetron oscillator to stop the oscillations very rapidly when power is removed from the magnetron oscillator. The discharge of the magnetron oscillator is begun the instant power is removed from the magnetron oscillator and oscillations thereafter are stopped very rapidly to insure complete shutdown of the magnetron oscillator during the brief off period. After power has been restored to the magnetron oscillator, the magnetron oscillator rapidly turns on.

The present invention contemplates a grounded anode magnetron oscillator receiving energizing power through a normally conductive vacuum tube, preferably a pentode.

The magnetron oscillator has connected across it a second vacuum tube. When the control grid of the pentode is pulsed by a negative pulse the normally conducting pentode is cut off, removing power from the cathode of the magnetron oscillator. At the same time, and as a result of the pentode being cut off, the second vacuum tube is made conductive thereby providing a discharge circuit of a low impedance across the magnetron oscillator.

The present invention eliminates the need for a driving source with its attendant disadvantages. Since there is no excessive heat generation when the circuit of the present invention is used, it is unnecessary to provide a large number of circuit elements used for the purpose of protecting the magnetron oscillator from the excessive heat. This alone results in the elimination of a large number of electrical elements and thereby greatly reduces the physical size of this circuit compared to the conventional driving circuits. Furthermore, the circuit of the present invention results in no appreciable phase shift of the magnetron oscillator which may occur as a result of being rapidly turned off and on. The circuit of the present invention has the further advantage of being more reliable than driving circuit methods for discharging a magnetron oscillator because of the lesser number of electrical elements used and the lack of phase shift.

An object of the present invention is to provide a circuit for a quick discharge of a magnetron oscillator after removal of power from the magnetron oscillator.

Another object of the present invention is to provide a circuit to remove power from the magnetron oscillator and at the same time provide means for quickly stopping the oscillations of the magnetron oscillator after power has been removed.

A further object of the invention is the provision of a novel electronic circuit for removing power from a magnetron oscillator for a short period of time and at the same time insuring that the magnetron oscillator will not oscillate during the period in which power is removed.

Still another object of the present invention is to provide a circuit for turning off a magnetron oscillator for short durations of time having means for preventing oscillations of the magnetron oscillator during the off period.

Yet another object of the present invention is to provide a magnetron quick discharge circuit which completely shuts off a magnetron oscillator which uses a minimum number of electronic components and which does not cause excessive heat generation in the magnetron oscillator.

The exact nature of this invention as well as other objects and advantages thereof will be readily apparent from consideration of the following specification relating to the annexed drawing in which:

The FIGURE shows a schematic view of the preferred embodiment of the invention.

Referring now to the figure there is shown a magnetron oscillator 10 having an anode 11, a cathode 12, and a coupling element 13. The anode of the magnetron oscillator is grounded through conductor 14. The cathode of the magnetron oscillator 10 is connected via resistors 15 and 16 to the anode 18 of vacuum tube 17 which is preferably a pentode. The cathode 19 of the vacuum tube 17 is connected to a negative direct voltage source.

The anode 11 of magnetron oscillator 10 is connected through resistor 21 to the anode 23 of a vacuum tube 22. The cathode 24 of vacuum tube 22 is connected directly to the cathode of the magnetron oscillator 10. The control grid 25 of vacuum tube 22 is connected through resistor 26 to the junction point of resistors 15 and 16. A capacitor 27 is connected directly between the anode 18 of vacuum tube 17 and the control grid 25 of vacuum tube 23.

The control grid 20 of vacuum tube 17 is biased just above cutoff via resistor 28 connected to a bias voltage. Therefore, vacuum tube 17 is normally conducting and supplying voltage to the cathode 12 of magnetron oscillator 10. Thus, the magnetron oscillator draws current through resistor 15 biasing tube 22 to a point where it is cut off. At the same time capacitor 27 is charged in the polarity shown.

When a negative pulse P is applied to control grid 20 of vacuum tube 17, tube 17 is cut off. Thus, power to the magnetron is turned off. When tube 17 is cut off, the negative bias to control grid 25 of tube 22 is removed. At the same time, capacitor 27 discharges through resistors 26 and 16, placing a positive voltage bias on tube 22. Tube 22 therefore becomes conductive and presents a very low impedance across the magnetron oscillator 10 causing it to discharge rapidly. Therefore, the magnetron oscillator 10 is quickly turned off and stopped from oscillating very rapidly.

When the trailing edge of the pulse P causes tube 17 to again become conductive, power is again supplied to cathode 12 of magnetron oscillator 10. At the same time, the voltage drop across resistor 15 biases the control grid 25 of vacuum tube 20 to below cutoff and the magnetron oscillator turns on very rapidly.

The above described operation is repeated every time a negative pulse such as P is applied to the grid 20 of vacuum tube 17.

The novel circuit which has been described provides for the extremely rapid removal and subsequent reapplication of power to the magnetron oscillator which allow the magnetron oscillator to be turned off for very short durations without undesirable oscillations occurring during the short period of shut off.

What is claimed is:

1. A quick discharge circuit, comprising in combination: a magnetron oscillator, power supply means, switch means connecting said power supply means to said magnetron oscillator for energizing said magnetron oscillator, vacuum tube means connected across said magnetron oscillator, first means connected between said switch means and said vacuum tube means biasing said vacuum tube below cutoff when said magnetron oscillator is energized, second means connected to said switch means for disconnecting said power supply from said magnetron oscillator, third means connected between said switch means and said vacuum tube biasing said vacuum tube to conduction when said magnetron oscillator is disconnected from said power supply whereby said magnetron oscillator is quickly turned off when said power supply is disconnected.

2. A quick discharge circuit, comprising in combination: a magnetron oscillator, power supply means, normally closed switch means connecting said power supply means to the cathode of said magnetron oscillator for energizing said magnetron oscillator, normally opened switch means shunting said magnetron oscillator when said normally opened switch means are closed, first means for opening said normally closed switch means to disconnect said power supply means from the cathode of said magnetron oscillator, second means connecting said normally opened switch means to said normally closed switch means responsive to the opening of said normally closed switch means to close said normally opened switch means whereby said magnetron oscillator is discharged when said power supply is disconnected from said magnetron oscillator.

3. A quick discharge circuit, comprising in combination: a magnetron oscillator, normally conductive vacuum tube means, resistor means connected between the cathode of said magnetron oscillator and the anode of said normally conductive vacuum tube means, power supply means connected to the cathode of said normally conductive vacuum tube means energizing said magnetron oscillator through said resistor means, normally nonconductive vacuum tube means connected across said magnetron oscillator, means connected between the anode of said normally conducting vacuum tube means and the control grid of said normally nonconductive vacuum tube means for turning on said normally nonconductive vacuum tube means when said normally conductive vacuum tube means is cut off whereby the voltage across said magnetron oscillator is rapidly decreased.

4. A quick discharge circuit, comprising in combination: a magnetron oscillator, first conductor means connecting the anode of said magnetron oscillator to ground, a first vacuum tube, a negative voltage supply connected to the cathode of said first vacuum tube, first resistor means connected to the anode of said first vacuum tube, second resistor means connected to the cathode of said magnetron oscillator, terminal means connecting said first and second resistor means forming a series circuit with said magnetron oscillator and said first vacuum tube, a second vacuum tube, second conductor means connecting the respective anodes of said magnetron oscillator and said second vacuum tube, third conductor means connecting the respective cathodes of said magnetron oscillator and said second vacuum tube, third resistor means connected between said terminal means and the control grid of said second vacuum tube, capacitor means connected between the anode of said first vacuum tube and the control grid of said second vacuum tube whereby said second vacuum tube is made conductive to discharge said magnetron oscillator when said first vacuum tube is cut off.

No references cited.